United States Patent [19]
Xu

[11] Patent Number: 6,011,871
[45] Date of Patent: Jan. 4, 2000

[54] METHOD AND APPARATUS FOR COMPRESSING DIGITAL DATA

[75] Inventor: Fan Xu, Katy, Tex.

[73] Assignee: BMC Software, Inc., Houston, Tex.

[21] Appl. No.: 08/947,665

[22] Filed: Oct. 9, 1997

[51] Int. Cl.[7] ............................ G06K 9/36; G06F 7/00
[52] U.S. Cl. ................................... 382/240; 395/444
[58] Field of Search ................................ 382/232, 238, 382/240, 244; 395/601, 603, 605, 607, 611, 613, 427, 444; 341/51, 79

[56] References Cited

U.S. PATENT DOCUMENTS

| | | | |
|---|---|---|---|
| 5,274,805 | 12/1993 | Ferguson et al. | 395/600 |
| 5,442,350 | 8/1995 | Iyer et al. | 341/51 |
| 5,534,861 | 7/1996 | Chang et al. | 341/79 |
| 5,592,667 | 1/1997 | Bugajski | 395/613 |
| 5,610,603 | 3/1997 | Plambeck | 341/51 |

*Primary Examiner*—Jose L. Couso
*Assistant Examiner*—Duy M. Dang
*Attorney, Agent, or Firm*—Vinson & Elkins L.L.P.

[57] ABSTRACT

The present invention compresses data by initializing a compression tree and creating a plurality of first layer nodes therein. Then, digital data to be compressed is received. Child nodes which contain the digital data to be compressed are formed. A first portion of these child nodes is placed into the compression tree, with the child nodes in the first portion being referenced by child pointers. Next, a second portion of the child nodes is inserted into the compression tree in the form of a plurality of sibling groups, with each sibling group having a common parent node. The child nodes in each sibling group are arranged according to a predefined sorting criteria. Each of the child nodes in the sibling groups is referenced by a sibling pointer. As more data to compress is received, child nodes continue to be inserted into the sibling groups according to the predefined sorting criteria. As additional child nodes are inserted into the compression tree, index values which define a path from one of the first layer nodes to one of the child nodes are outpult, with the index values representing the compressed data. Data is decompressed by initializing a decompression tree and creating a plurality of first layer nodes therein. Then, the index values which represent the compressed digital data are processed. First, a matching node in the decompression tree is found which has the received index value. A path from the matching node to a node in the first layer of nodes is then found and the data values associated with nodes encountered in the path are output, thereby converting the index values into decompressed data.

24 Claims, 6 Drawing Sheets

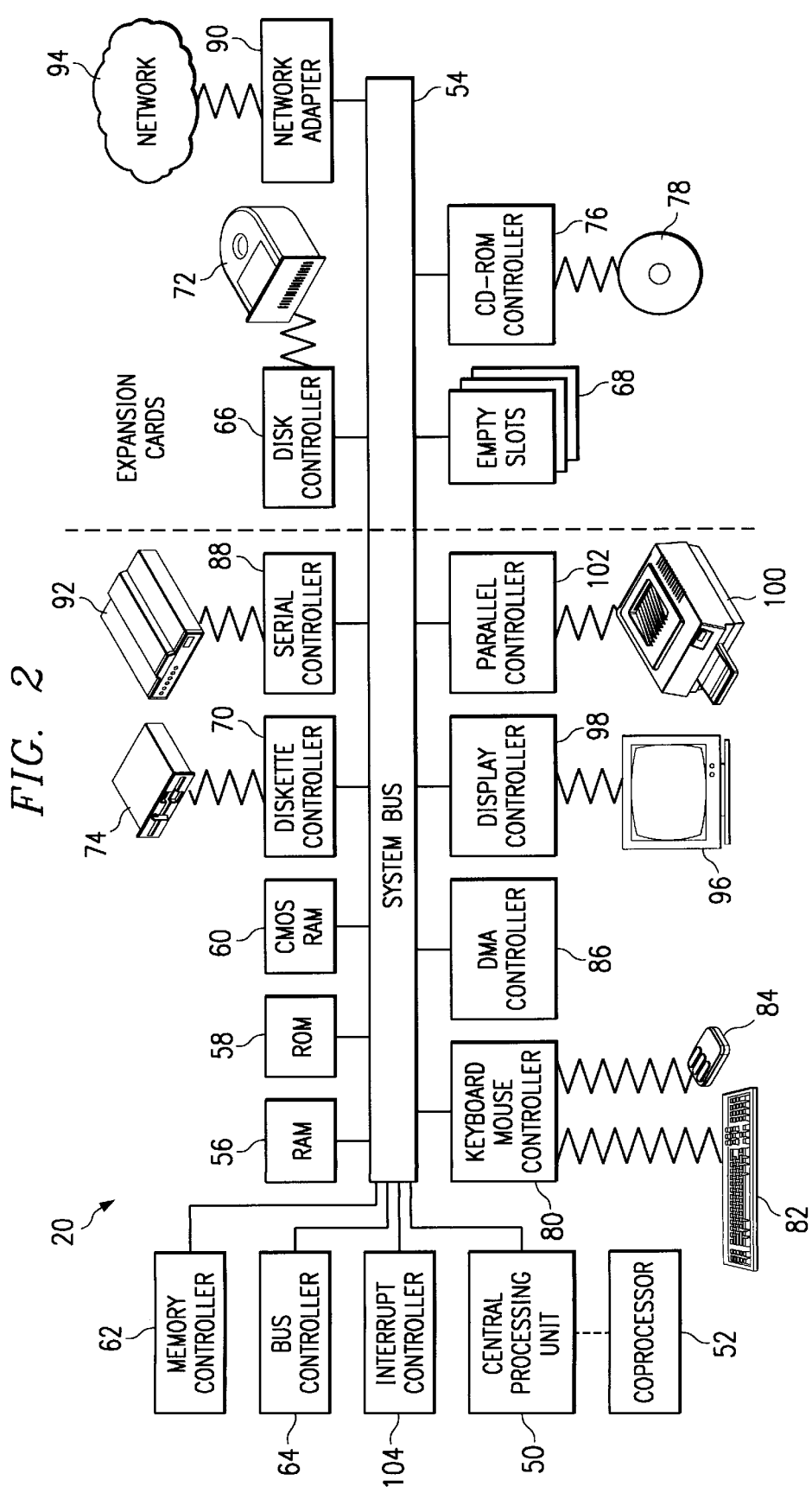

METHOD AND APPARATUS FOR COMPRESSING DIGITAL DATA

BACKGROUND OF THE INVENTION

1. Technical Field

Generally, the present invention relates to compressing digital data. Specifically, the present invention relates to compressing digital data in real-time environments by using tree structures to compress and decompress the data.

2. Description of the Related Art

The ability to communicate digital information from one point to another is an important part of the modern world. Due to this importance, digital communication products are continually improved, allowing for more data to be communicated between two points at ever increasing speeds. However, every type of digital communication system has inherent limitations on the amount of data which can be transmitted. In light of these limitations, the need to efficiently transmit digital data over a given medium is always present.

One common manner to increase the efficiency of a digital communication is to compress the data before it is sent, then decompress the data upon reception. In this way, the same information is sent using less data to represent the information. Some compression methods compress data in such a manner that a portion of the information originally contained in the data is lost. When this data is received and decompressed, the data only represents an approximation of the original information. These type of compression methods allow for very large compression ratios to be achieved, and are commonly used when transmitting audio and visual information (e.g., voice conversations, music, and television signals) which is meant to be consumed by the human senses. Studies have shown that the human senses of sight and hearing often cannot detect the absence of the information removed by the compression routines, thus, the quality of the information is not perceptively affected and the information is transmitted more efficiently.

For other types of digital communications, the loss of even a single piece of information can render the entire transmission unusable. This is often the case when one data processing system is communicating with another. In these instances, the compression routines must compress the data to be transmitted in such a manner that all of the information contained in the original message is present in the compressed form of the message.

Such compression/decompression routines are often measured in terms of their compression efficiency, and the rate at which they can compress the data. Many routines strive to optimally compress a given set of data, but suffer from the fact that they must extensively process the data during this compression, and hence execute slowly. Other compression/decompression routines cannot efficiently compress a set of data, but these routines often compress the data very quickly. Both types of compression/decompression routines find use in the many types of digital communication systems now available.

However, it would be desirable to create a set of compression/decompression routines which achieves a high compression efficiency, while not requiring the data to be processed extensively. Such routines would find use in the many digital communication systems that benefit from transmitting highly compressed data, but cannot afford to spend a great amount of time compressing and decompressing the data. One example of a digital communication system which would benefit from such compression/decompression routines is a typical local area network. The data processing systems typically connected to a local area network often do not have the processing power to extensively compress and decompress data in a timely manner. However, those local area networks would benefit greatly from having to communicate smaller amounts of data.

SUMMARY OF THE INVENTION

Therefore, it is one object of the present invention to achieve high compression ratios in compressing digital data.

It is another object of the present invention to compress and decompress digital data in real-time, thereby allowing data processing systems to use the present invention while sending and receiving data.

These and other objects are achieved as follows. When characterized as a method for compressing digital data, the present invention compresses data by initializing a compression tree and creating a plurality of first layer nodes therein. Then, digital data to be compressed is received. Child nodes which contain the digital data to be compressed are formed. A first portion of these child nodes is placed into the compression tree, with the child nodes in the first portion being referenced by child pointers. Next, a second portion of the child nodes is inserted into the compression tree in the form of a plurality of sibling groups, with each sibling group having a common parent node. The child nodes in each sibling group are arranged according to a predefined sorting criteria. Each of the child nodes in the sibling groups is referenced by a sibling pointer. As more data to compress is received, child nodes continue to be inserted into the sibling groups according to the predefined sorting criteria. As additional child nodes are inserted into the compression tree, index values which define a path from one of the first layer nodes to one of the child nodes are output, with the index values representing the compressed data.

Data is decompressed by initializing a decompression tree and creating a plurality of first layer nodes therein. Then, the index values which represent the compressed digital data are processed. First, a matching node in the decompression tree is found which has the received index value. A path from the matching node to a node in the first layer of nodes is then found and the data values associated with nodes encountered in the path are output, thereby converting the index values into decompressed data.

The present invention can also be characterized as a data processing system which implements the method described above, or a computer program product which contains computer-readable instructions which direct a data processing system to implement the method.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is a high level block diagram which further illustrates the major components that may be included in the data processing system of FIG. 1;

DETAILED DESCRIPTION OF THE INVENTION

Figure 1:
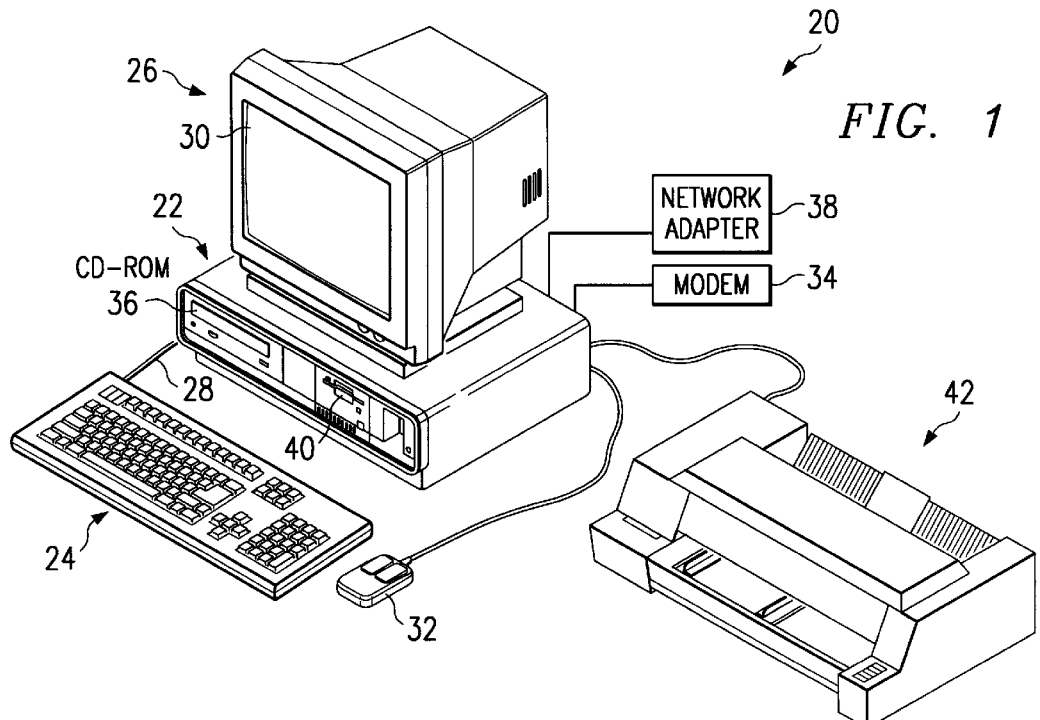
FIG. 1 depicts a general purpose data processing system upon which the present invention can be implemented.

FIG. 1 depicts a general purpose data processing system upon which the present invention can be implemented. Data processing system 20 includes processor 22, keyboard 24, and display 26. Keyboard 24 is coupled to processor 22 by cable 28. Display 26 includes display screen 30, which may be implemented utilizing a cathode ray tube (CRT), a liquid crystal display (LCD), an electroluminescent panel, or the like. Data processing system 20 also includes pointing device 32, which may be implemented utilizing a track ball, joystick, touch sensitive tablet or screen, trackpad, glidepad, or as illustrated in FIG. 1, a mouse. Pointing device 32 may be utLlized to move a pointer or cursor on display screen 30. Processor 22 may also be coupled to one or more peripheral devices, such as modem 34, CD-ROM 36, network adaptor 38 and floppy disk drive 40, each of which may be internal or external to the enclosure of processor 22. An output device such a printer 42 may also be coupled to processor 22.

Those persons skilled in the art of data processing system design should recognize that display 26, keyboard 24, and pointing device 32 may each be implemented utilizing any one of several known off-the-shelf components. Data processing system 20 may be implemented utilizing any general purpose computer or so-called personal computer, such as those sold by Compaq, Dell, Apple, Sun, and others.

With reference now to FIG. 2, there is depicted a high level block diagram which further illustrates the major components that may be included in data processing system 20 of FIG. 1. Data processing system 20 is controlled primarily by computer readable instructions, which may be in the form of software, wherever, or by whatever means such software is stored or accessed. Such software may be executed within central processing unit (CPU) 50 to cause data processing system 20 to do work. In many workstations and personal computers, central processing unit 50 is implemented by a single-chip CPU called a microprocessor. An example of such a microprocessor is the microprocessor sold under the trademark "PENTIUM" by Intel Corporation.

Coprocessor 52 is an optional processor, distinct from main CPU 50, that performs additional functions or assists CPU 50. One common type of coprocessor is the floating-point coprocessor, also called a numeric or math coprocessor, which is designed to perform numeric calculations faster and better than general-purpose CPU 50. Recently, however, the functions of many coprocessors have been incorporated into more powerful single-chip microprocessors.

CPU 50 fetches, decodes, and executes instructions, and transfers information to and from other resources via the computer's main data-transfer path, system bus 54. Such a system bus connects the components in data processing system 20 and defines the medium for data exchange. System bus 54 typically includes data lines for sending data, address lines for sending addresses, and control lines for sending interrupts and for operating the system bus. In some, embodiments, system bus 54 uses the same lines for both data and address communications. An example of such a system bus is the PCI (Peripheral Component Interconnect) bus. Many system busses provide a function called bus arbitration that regulates access to the bus by extension cards, controllers, and CPU 50. Devices that attach to such a system bus and arbitrate to take-over the bus are called bus masters.

Memory devices coupled to system bus 54 include random access memory (RAM) 56, read only memory (ROM) 58, and nonvolatile memory 60. Such memories include circuitry that allows information to be stored and retrieved. ROMs contain sorted data that cannot be modified. Data stored in RAM can be read or changed by CPU 50 or other hardware devices. Nonvolatile memory is memory that does not lose data when power is removed from it. Nonvolatile memories include ROM, EPROM, EEPROM, bubble memory, or batter-backed CMOS RAM. As shown in FIG. 2, such battery-backed CMOS RAM may be utilized to store system configuration information.

Access to RAM 56, ROM 58, and nonvolatile memory 60 may be controlled by memory controller 62 and bus controller 64. Memory controller 62 may provide an address translation function that translates virtual addresses into physical addresses as instructions are executed. Memory controller 62 may also provide a memory protection function that isolates processes within the system and isolates system processes from user processes. Thus, a program running in user mode can access only memory mapped by its own process virtual address space; it cannot access memory within another process's virtual address space unless memory sharing between the processes has been set up.

An expansion card or expansion board is a circuit board, that includes chips and other electronic components connected in a circuit, which adds functions or resources to the computer. Typical expansion cards add memory, disk-drive controllers 66, video support, parallel and serial ports, and internal modems. For laptop, palmtop, and other portable computers, expansion cards usually take the form of PC Cards, which are credit card-size devices designed to plug into a slot in the side or back of a computer. An example of such a slot is the PCMCIA slot (Personal Computer Memory Card International Association) which defines type I, II and III card slots. Thus, empty slots 68 may be used to receive various types of expansion cards or PCMCIA cards.

Disk controller 66 and diskette controller 70 both include special-purpose integrated circuits and associated circuitry that direct and control reading from and writing to a hard disk drive 72 and a floppy disk or diskette 74, respectively. Such disk controllers handle tasks such as positioning the read/write head, mediating between the drive and the microprocessor, and controlling the transfer of information to and from memory. A single disk controller may be able to control more than one disk drive.

CD-ROM controller 76 may be included in data processing 20 for reading data from CD-ROMs 78 (compact disk read-only memory). Such CD-ROMs use laser optics rather than magnetic means for reading data.

Keyboard mouse controller 80 is provided in data processing system 20 for interfacing with keyboard 82 and a pointing device, such as mouse 84. Such pointing devices are typically utilized to control an on-screen element, such as a cursor, which may take the form of an arrow having a hot-spot that specifies the location of the pointer when the user presses a mouse button. Other pointing devices include the graphics tablet, the stylus, the light pen, the joystick, the puck, the trackball, and the trackpad.

Direct memory access (DMA) controller 86 may be used to provide a memory access that does not involve CPU 50. Such memory access are typically employed for data transfer directly between memory and an "intelligent" peripheral device, such as between memory 56 and disk controller 66.

Communication between data processing system 20 and other data processing systems may be facilitated by serial controller 88 and network adaptor 90, both of which are coupled to system bus 54. Serial controller 88 is utilized to transmit information between computers, or between a computer and peripheral devices, one bit at a time over a single line. Serial communications can be synchronous (controlled by some time standard such as a clock) or asynchronous (managed by the exchange of control signals that govern the flow of information). Examples of serial communications standards include the RS-232 interface and the RS-422 interface.

As illustrated, such a serial interface may be utilized to communicate with modem 92. A modem is a communications device that enables a computer to transmit information over a standard telephone line. Modems convert digital computer signals to analog signals suitable for communication over telephone lines. Modem 92 may provide a connection to sources of software, such as a server, an electronic bulletin board, and the Internet or World Wide Web.

Network adapter 90 may be used to connect data processing system 20 to a local area network 94. Network 94 may provide computer users with means of communicating and transferring software and information electronically. Additionally, network 94 may provide distributed processing, which involves several computers and the sharing of workloads or cooperative efforts in performing a task.

Display 96, which is controlled by display controller 98, is used to display visual output generated by data processing system 20. Such visual output may include text, graphics, animated graphics, and video. Display 96 may be implemented with a CRT-based video display, an LCD-based flat-panel display, or a gas plasma-based flat-panel display. Display controller 98 includes electronic components required to generate a video signal that is sent to display 96.

Printer 100 may be coupled to data processing system 20 via parallel controller 102. Printer 100 is used to put text or a computer-generated image on paper or on another medium, such as a transparency. Other types of printers may include an image setter, a plotter, or a film recorder.

Parallel controller 102 is used to send multiple data and control bits simultaneously over wires connected between system bus 54 and another parallel communication device, such as printer 100. The most common parallel interface is the Centronics interface.

During data processing operations, the various devices connected to system bus 54 may generate interrupts which are processed by interrupt controller 104. An interrupt is a request for attention from CPU 50 that can be passed to CPU 50 by either hardware or software. An interrupt causes the microprocessor to suspend currently executing instructions, save the status of the work in progress, and transfer control to a special routine, known as an interrupt handler, that causes a particular set of instructions to be carried out. Interrupt controller 104 may be required to handle a hierarchy of interrupt priorities and arbitrate simultaneous interrupt requests. Interrupt controller 104 may also be used to temporarily disable interrupts.

Figure 3:
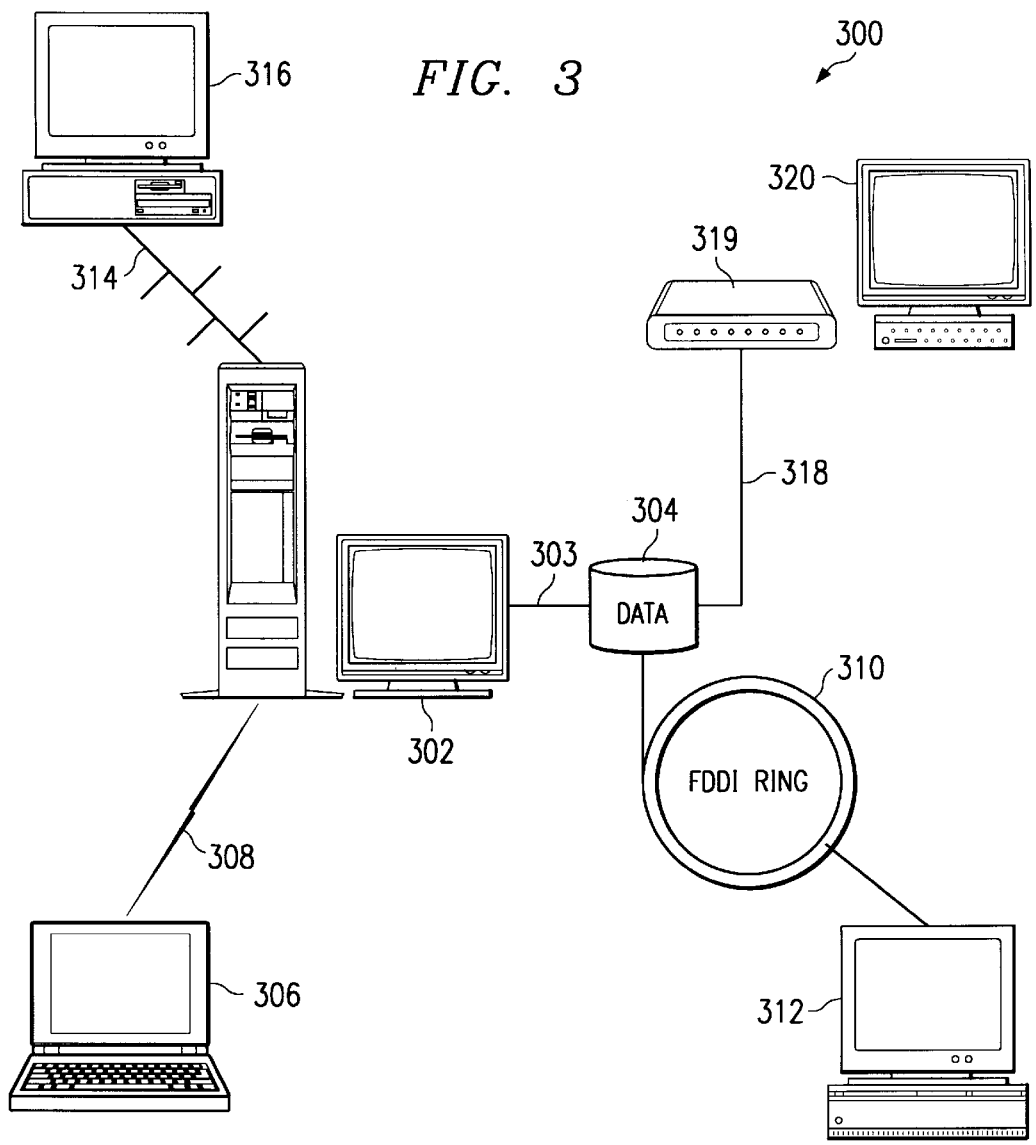
FIG. 3 illustrates a computer network upon which the present invention can be implemented.

FIG. 3 illustrates a computer network according to the present invention. Central to network 300 is server 302 and data storage device 304. Server 302 is connected to data storage device 304 via communications link 303. Server 302 and data storage device 304 operate to supply data to the computing devices connected to network 300. Personal computer 316 is connected to server 302 via Ethernet 314. This connection can be accomplished in many ways, as known in the art. Not shown in FIG. 3 are the bridges, routers, multiplexers, and other intermediate devices which are commonly found in an Ethernet network.

Work station 320 is connected to server 302 using modem 319. Modem 319 allows work station 320 to send and receive digital signals over public telephone network 318. Using a modem allows users to access server 302 when they do not have access to a network connection. However, sending and receiving data using a modem is generally slower and sending than receiving data over a network such as Ethernet network 314.

Laptop computer 306 is connected to server 302 via wireless network 308. This type of connection can be used by persons operating in the field. Wireless network 308 can be implemented using satellites, cellular technology, Packet technology, or other generally available wireless communication protocols.

Computer 312 is connected to server 302 via FDDI network 310 FDDI network 310 is usually implemented with a fiber optic cable. Generally, fiber optic cables have a much greater bandwidth than traditional copper transmission lines.

The computer network shown in FIG. 3 is but a sample representation of the many types of digital communication network currently available. The present invention can be implemented on almost any type of communications network which transmits digital information. Therefore, the example of the network shown in FIG. 3 should not limit the possible application of the present invention.

The Compression Method

Figure 4:
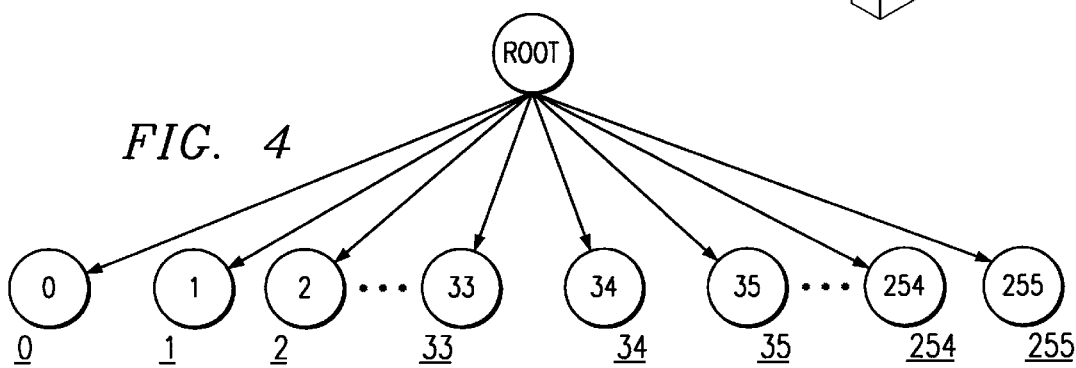
FIG. 4 illustrates the compression tree as it appears immediately ifter initialization.
Figure 5:
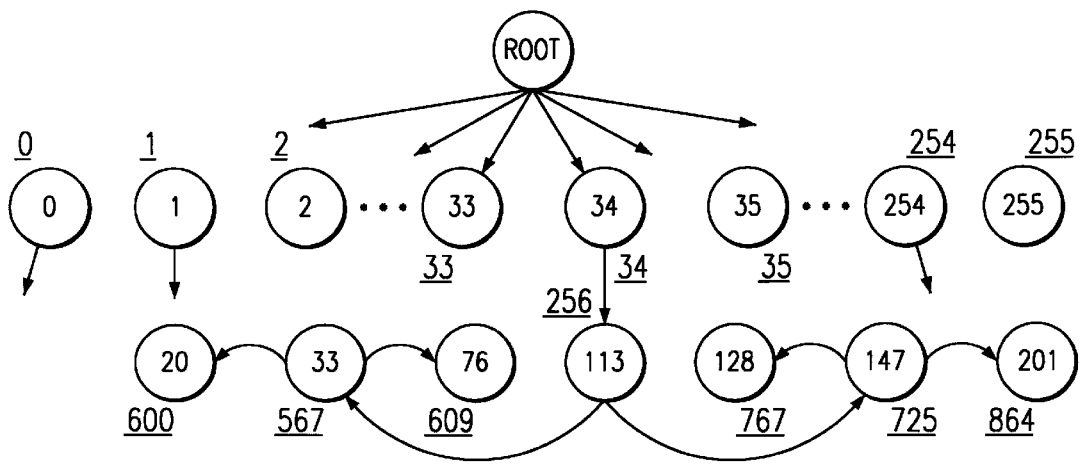
FIG. 5 depicts a partially built compression tree according to the present invention.
Figure 6:
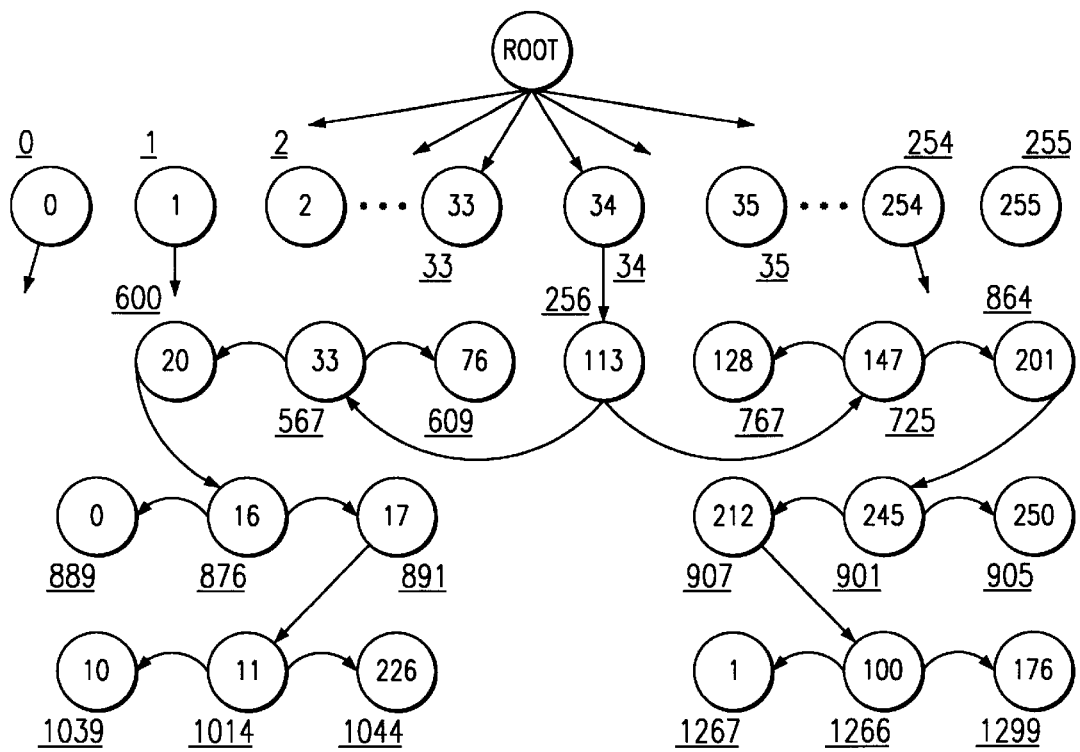
FIG. 6 shows the compression tree shown in FIG. 5 with additional nodes.

FIGS. 4–6 represent compression trees which illustrate the method by which the present invention compresses data. According to the present invention, data is compressed by building a tree structure, and associating index values with each node of the tree. The tree is formed in such a way that there is a unique path from a node located at the end of the tree to the tree's root. Thus, by specifying the index associated with a node at the end of the tree, the values of intermediate nodes located in the path between the node at the end of the tree and the root can be specified.

FIG. 4 illustrates the compression tree as it appears immediately after initialization. Initially, 256 nodes are positioned as a first layer of children of the tree's root. In FIG. 4 (and for the other figures in this Specification which depict a tree structure), the nodes, are denoted by circles, and the value within each circle is the data value of the node. The underlined numbers located near each node represent the index value of the node.

Each node in the compression tree has a data field, a child pointer, a left sibling pointer, and a right sibling pointer. The data field stores the data value for each node. In i preferred embodiment of the present invention, the data field stores a one byte value. Each node in the tree is referenced by an index value. The index for a given node is determined by computing the offset from the start of an area of contiguous memory allocated for the nodes in the tree. The index for a node uniquely identifies the node with respect to all of the other nodes in the tree. In a preferred embodiment of the present invention, up to 65,536 nodes exist in a given tree. When data is compressed, only index values are transmitted or stored to be decompressed.

The child pointer points to a node's child, residing in a layer below the present node. A node can have many children, however, only one of these children is directly accessible. A node's other children are accessible by traversing a node's child's left sibling pointer and right sibling pointer.

The left sibling pointer and right sibling pointer point to a node's siblings, which are contained in the same layer of the tree as the node containing the pointers. As the tree is built, the node and its siblings, existing in a given layer, are arranged in a predefined manner. In a preferred embodiment of the present invention, the nodes pointed to by a node's left sibling pointer contain a data value less than the node which is pointing to it. Likewise, the node which is pointed to by a node's right sibling pointer contains a data value greater than the node which is pointing to it. Maintaining the data values of a layer of nodes in a structured manner enables the tree to be quickly searched and data to be compressed efficiently.

The trees shown in FIGS. 4–6 compress data by alternately matching as many consecutive bytes as possible to a path in the tree, outputting an index value for the last node in the tree which matches a byte in the input stream, and then updating the tree with the next byte for which there is no match. The tree is initialized as shown in FIG. 4 so that for any byte received in an input stream, the byte can be guaranteed to match a node in the tree, and an index value output for that byte.

FIG. 5 illustrates a partially built compression tree according to the present invention. The following description of how the tree shown in FIG. 5 is built will illustrate the method of the present invention. When describing a tree in this Specification, nodes will be referenced by referring to the node's index value. Thus, in FIG. 5, node 0 is the node in the upper left-hand corner of the figure, while node 864 is located in the lower right-hand corner. Also, the heavy lines with an arrow at the end represent a node's child pointer, while the light lines with an arrow at the end represent a node's sibling pointers. For illustrative purposes, not all of the nodes in the tree are shown. For instance, node 0 is shown with its child pointer pointing to a node that is not shown in FIG. 5.

The tree shown in FIG. 5 was created when compression routines operating according to the present invention were initiated to compress a stream of data. Initially, these routines created a tree like the one in FIG. 4. Upon initialization, the child, right sibling, and left sibling pointers for each node in the first layer of the tree are set to NULL. The left and right sibling pointers for each of the root nodes in the initial tree will remain set to NULL. However, each of the first layer nodes' children, grandchildren, etc. can have siblings.

The first two bytes received by the compression routines have the values of 34 and 113. Upon receiving this sequence, the compression routines matched the first byte, 34, with the node having the same data value. Next, the compression routines tried to match the second byte, 113, to a child of node 34 having the same data value. However, since 34 and 113 were the first bytes received by the compression routines after having initialized the tree, node 34 had no children. In this case, a child was created for node 34, having a data value of 113, and an index of 256. In a preferred embodiment of the present invention, the index value to be assigned to the next node is simply a value that is incremented by one every time a new node is added to the tree. In the present example, the index value to be assigned to the next node was initialized as 256, since the first 256 nodes in the first layer of the tree (nodes 0–255) are already present before the first byte in the input stream was received.

After the child having a value of 113 is added to node 34, the compression routines output the index of the parent of the node just added. In this case, an index value of 34 was output. As is described below, this value will subsequently be used by the decompression routines to recreate the compressed message.

After outputting an index value and adding a node, the compression routines began to process additional data in the input stream, using the data value of the node just added as the starting byte to be compressed. In the present example, this was 113. Processing continued with the compression routines matching 113 to node 113, not shown in FIG. 5.

Sometimes later, the compression routines received a byte sequence of 34, 33. The compression routines matched 34 to node 34, then tried to match 33 with one of the children of node 34. However, since node 34 had only one child, node 256 (having a data value of 113), the compression routines added 33 as a sibling of node 256. A new node was created having a data value of 33, and the child of node 34, node 256, had its left pointer assigned to the new node. The left pointer of node 256 was assigned to the new node because the data value of the new node, 33, is less than the data value of node 256 (which is 113). Also, the new node was assigned an index value, which happened to be 567. As was the case when node 256 was added, an index value of 34 is output, and processing started again with the value 33.

Sometimes after node 567 was added, the compression routines processed the values 34, 20. The compression routines matched the 34 to node 34, then examined the children of node 34. First, the routines followed the child pointer of node 34 to node 256. Next, since node 256 has a left sibling, the routines traversed to node 567, since 20 is less than the data value of node 256. Upon examining node 567, the compression routines did not match the value 20 to the data value of node 567. Further, since node 567 did not have a left sibling, a new node was created, having a data value of 20, an index of 600, and being pointed to by the left sibling pointer of node 567.

In a manner similar to the descriptions found above, nodes 609, 725, 767, and 864 are formed when the compression routines received the byte sequences of 34, 76; 34, 147; 34, 128; and 34, 201, respectively.

FIG. 6 depicts the tree structure shown in FIGS. 4 and 5, after several more nodes have been added to the tree. Nodes 889, 876, 891, 901, 907, and 905 have been added as children of node 34, and siblings of node 256. In addition to node 34, nodes 891 and 907 have their own children. In the case of node 891, sometimes after adding node 891, the compression routines received the byte sequence 34, 17, 11. The compression routines matched the 34 to node 34, then traversed the children of node 34 looking for a node with the value of 17. Since node 891 was in existence at this time, the compression routines then examined the child pointer of node 891 In the example shown in FIG. 6, it will be assumed that the child pointer of node 891 was NULL at this time. Thus, when the compression routines examined node 891, they added a child to node 891 which has a data value of 11.

In the present example, this child node has been assigned the index value of 1014. Before processing another set of data, the compression routines output the index value of 891. The next set of data started with the value of 11, which represented the last byte which was added to the tree, but for which a match was not found.

In a manner similar to the addition of node 1014, node 1266 gets added to the tree. Assuming node 907 already exists, when the compression routines received the byte sequence 34, 212, 100, they proceeded to output the index value 907 and add node 1266. Nodes 1039, 1044, 1267, and 1299 were added as siblings of nodes 1014, and 1266, respectively, in the same manner as the siblings of node 256.

Figure 7:
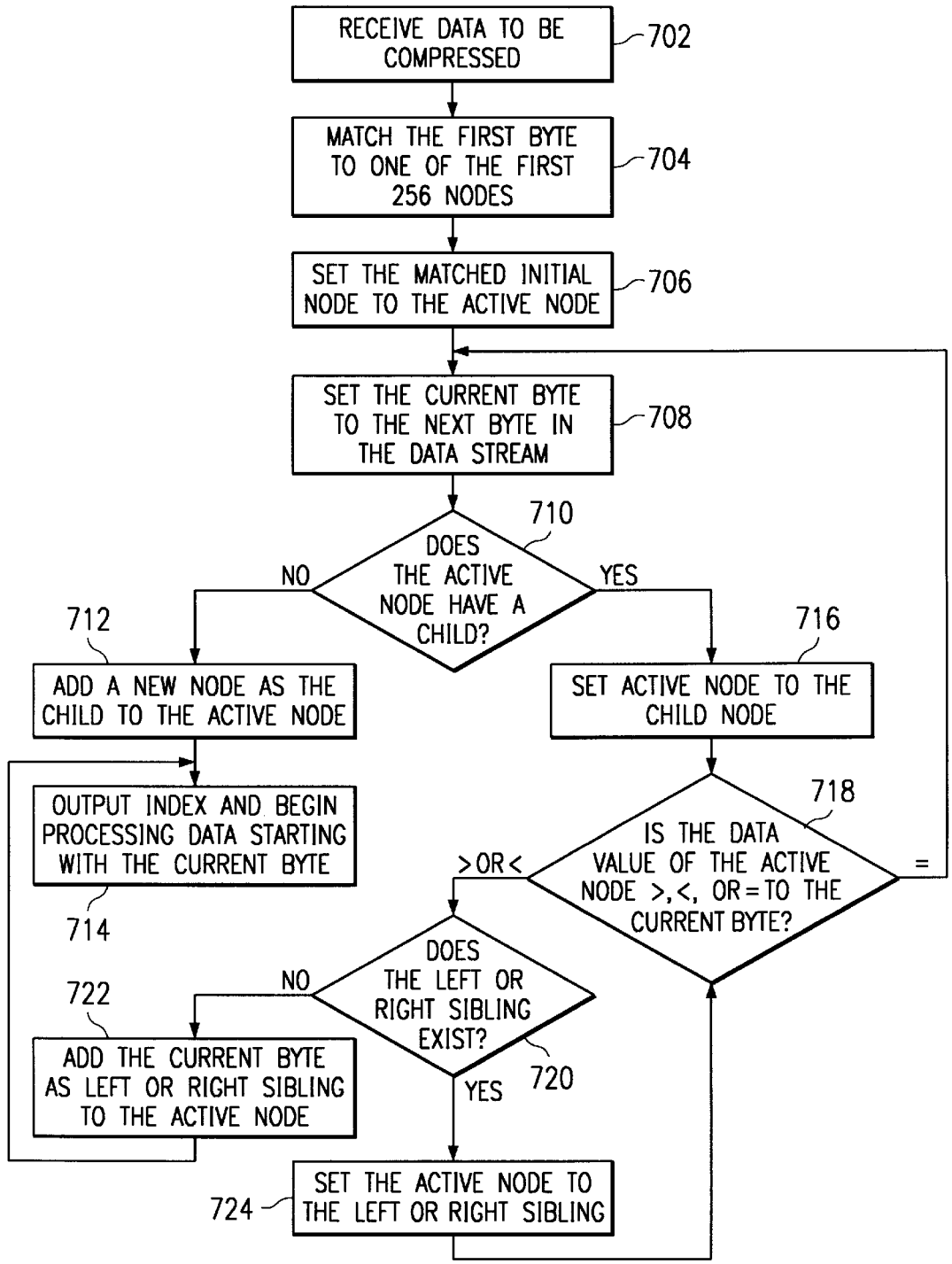
FIG. 7 is a flowchart which illustrates how data is compressed according to the present invention.

The method described above is also shown in the flowchart of FIG. 7. Before step 702, the compression routines initialized a tree such as the one shown in FIG. 4. Next, the compression routines begin to receive data to be compressed (702). The compression routines then match the first byte of this data to one of the 256 original nodes that were created during initialization (704). Next, the node which matches the first byte of data is marked as the active node (706), and the next byte of data to be compressed is set to be the current byte (708). As the terms are used above, the active node is the node currently being examined by the compression routines, while the current byte is the byte that the compression routines are trying to match to the data value in the active node.

The active node is then examined to determine if it has a child by determining if the child pointer is not set to NULL (710). If the child pointer of the active node is set to NULL, a new node is added as the child of the active node (712). This new node will be assigned an index value and the data value will be the current byte (714). The index value of the active node will then be output, and the compression routines will begin the process starting with step 702, with the current byte being the first byte in the data stream to be compressed.

If the active node's child pointer is pointing to a child node (710), the child of the active node is set to be the active node (716). The compression routines then examine the child node (now the active node) to compare the current byte to the data value of the active node (718). If the data value of the active node is equal to the current byte, the compression routines will have found a match, and the process will begin again with the next byte in the data stream to be compressed (708). If the data value of the active node is either greater or less than the current byte, the siblings of the active node will be traversed (724), with the compression routines looking either for a match, or the proper place to insert the current byte into the list of siblings.

When traversing a list of siblings, one of two things can happen. Either a match is found and processing continues by analyzing the child pointer of the node which contained the data value which matched the current byte (708), or a node is discovered which does not have a left or right sibling which can be traversed (720). Such would be the case if the list of siblings was being traversed with the current byte having a value of 255, and a node was processed which had a data value of 254, but did not contain a right sibling. In this instance, the active node would be given a right sibling, having a data value of the current byte (722). Likewise, if a node is processed having a data value less than the current byte, and the active node has no left sibling, the value represented by the current byte will become the data value of the left sibling of the active node.

Using the methods described above, large trees with thousands of nodes can be constructed. In general, the compression ratio increases as the tree grows deeper. This is especially true if similar sequences of data are repeatedly received.

The Decompression Method

The decompression routines operating according to the present invention receive the indexes output by the compression routines and reconstruct the original input stream, thereby decompressing the data. The decompression routines accomplish this by reconstructing the tree built by the compression routines. Note, however, the tree built by the compression routines is not transmitted to the decompression routines. Rather, the tree is reconstructed by analyzing the indexes themselves.

The structure for nodes in the decompression tree is different than the structure for nodes in the compression tree. Like the tree formed by the compression routines, each node in the decompression tree contains a data field having a data value. Also, like the compression tree, each node is referenced by an index value which is calculated from the starting address of the area of memory which contains the nodes in the decompression tree. But, instead of having child, right sibling, and left sibling pointers, each node in the compression tree only has a parent pointer. As the name implies, the parent pointer of each node in the decompression tree points to the node's parent. The resulting structure allows for a path to be traversed from any node back to one of the 256 nodes in the first layer of the decompression tree.

Figure 8:
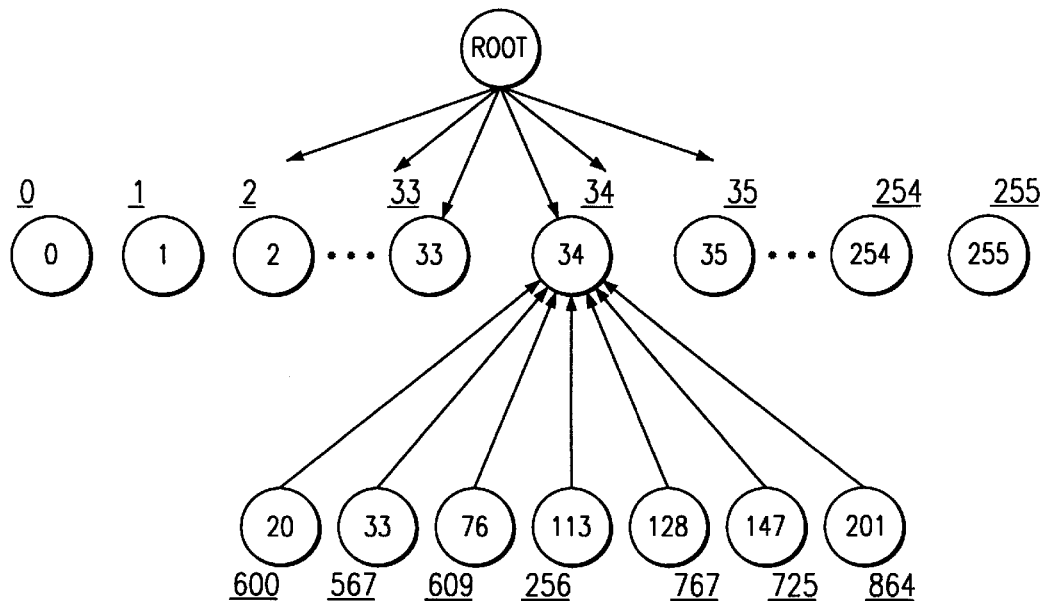
FIG. 8 illustrates a decompression tree according to the present invention.

FIG. 8 illustrates a decompression tree which corresponds to the compression tree shown in FIG. 5. This tree is generated and the input stream decompressed into an output stream by adding nodes to the tree in a manner similar to the compression tree, and by labeling the nodes with the same indexes as the compression tree. Initially, the tree is formed with the 256 possible bytes that can be received, as was the case for the compression tree. Next, an index is received. The index received will be the index of one of the 256 original nodes. When this index is received, a value which stores the location of the previous node indexed will be set to the node whose index is received. The value of the node specified by the received index must be stored, because the decompression routines know that when an index for a node is received, a child to that node has been added. However, the child which was added cannot be determined until the next index is processed. After processing the next index, the value of the child added to the node specified by the previously received index can be determined. At that point, a child will be added to the previously specified node, and the tree will mirror the compression tree.

In FIG. 8, the first index received is 34. Upon receipt of this index, the value of node 34 is put into the output stream and no node is added to the tree, as the decompression routines will have to process the next node to determine the value of the child added to node 34. Next, an index of 113 is received. When the compression tree added child 256 to node 34, it output the index of node 34, and began processing data starting with 113. Assuming that 113 was the second byte of the input stream processed by the compression tree, the second index output by the compression tree will be 113, since node 113 will not have any children. The third byte of the input stream will then be added as a child to node 113. Thus, the decompression tree, upon receiving the second index of 113, will know that a node whose data value is 113 needs to be added as a child to node 34. In this manner, all of the children of node 34 shown in FIG. 8 are added.

When processing a received index that does not specify one of the original 256 nodes, the node whose index is received is used as the starting place to trace a path back to one of the 256 nodes in the first layer. This is how compression occurs in the present invention. A single index can represent several nodes which exist in the decompression tree. When the decompression routines traverse such a trail of nodes, the routines note the data values of each node, and output these values into the output stream.

Figure 9:
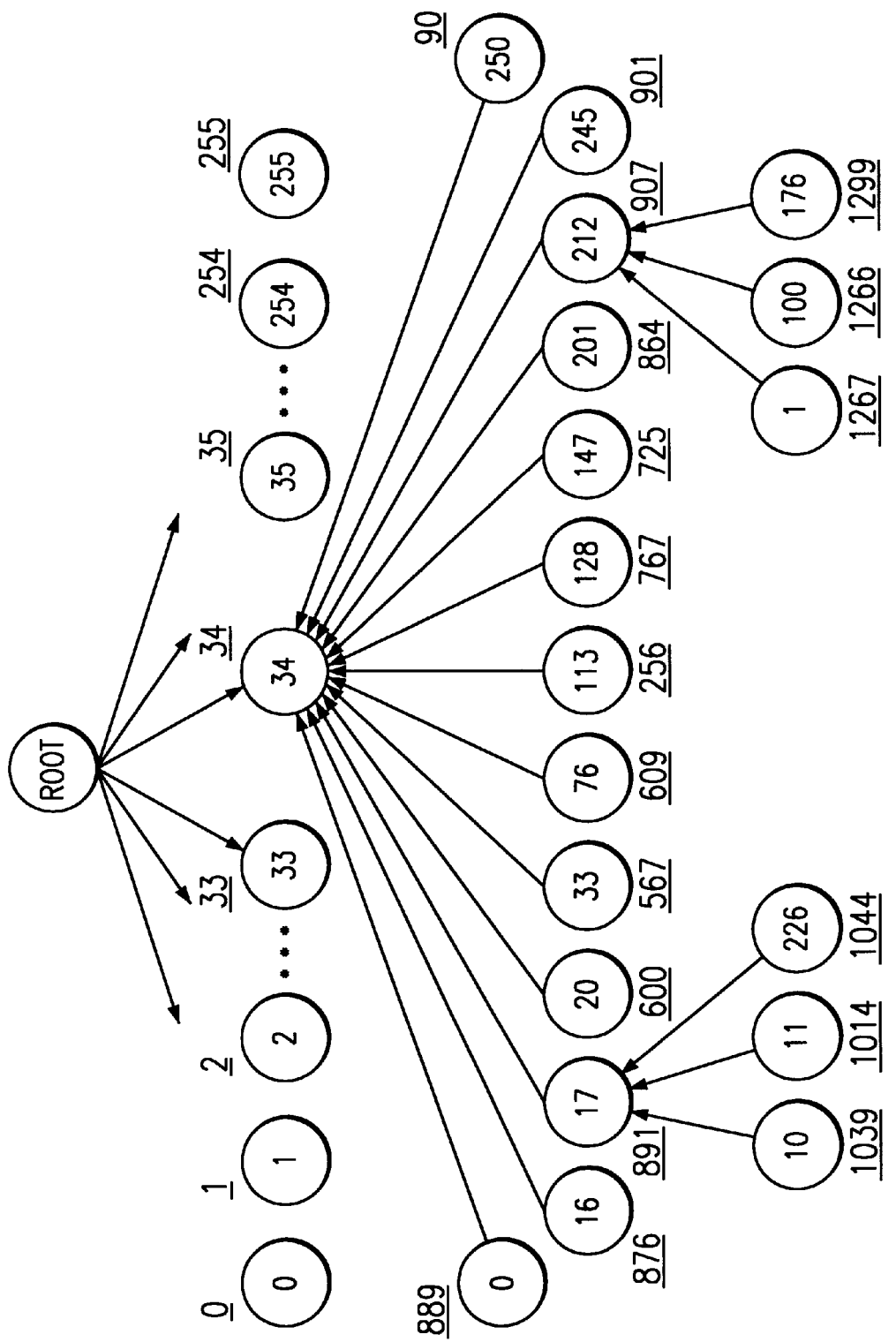
FIG. 9 shows the decompression tree of FIG. 8 with additional nodes.

FIG. 9 is a decompression tree which corresponds to the compression tree shown in FIG. 6. At some point, the compression routines may output an index sequence of 1266 and 600. The decompression routines would first process the index 1266. Initially, the decompression routines would locate the node having an index of 1266 in the decompression tree. Then, the path of parent pointers from node 1266 to one of the 256 nodes in the first layer would be Traversed. At this point, a node having the data value of 34 would be added to the node previously specified by the last received index. Then, the data values recorded from traversing the list would be reordered and put into the output stream. In the example shown in FIG. 9, the data values received from traversing node 1266 would be 100, 212, and 34. These data values must be reordered from first to last before being output, as the bytes originally appeared in the input stream as 34, 212, and 100. In essence, the decompression routines expand the compressed data in the reverse order from which it was received.

After outputting the values 34, 212, and 100 into the output stream, the decompression routines will examine the next index value received—600. Upon receipt of this index value, the decompression routines will add a child to node 1266 which has the data value of 34, since 34 is the node which exists at the end of the path specified by the index 600. The decompression routines will output the values 34 and 20 into the output stream, then will process another index.

Figure 10:
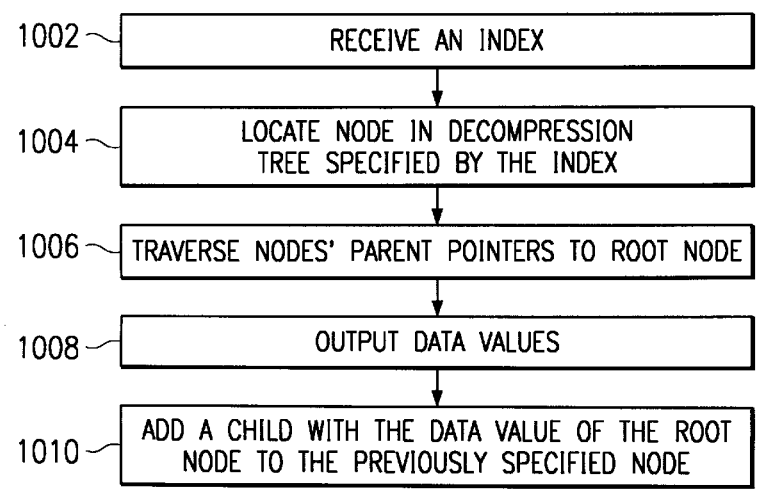
FIG. 10 is a flowchart which illustrates how data is decompressed according to the present invention.

FIG. 10 is a flowchart will illustrates the operation of the decompression routines according to the present invention. Initially, an index from the compression routines is received (1002). The node specified by this index is then referenced (1004). Next, the parent pointer of the node specified by the index is followed until one of the 256 nodes in the first layer is reached (1006). As these nodes are traversed, the data values of each node are recorded. The data values are then reordered, with the data value of the first layer node being first, and the data value of the node specified by the index value being last. The data values are then output into the output stream, (1008). Finally, a new child node is created. The parent of this child is the node specified by the previous index value, and has as its data value the data value of the first layer node in the path specified by the index value (1010).

The compression/decompression routines described above require a relatively small amount of a data processing system's resources when compared to other popular compression/decompression routines. A key aspect of the present invention is the arrangement of the sibling nodes in the compression tree. These sibling nodes are the nodes which are not directly pointed to by a parent node, such as nodes 567, 600, 609, 889, 876, 891, 767, 725, 864, 907, 901, and 905. Since these nodes are arranged with the smallest data value at the far left and the largest data value at the far right, very few comparison have to be made to either match a byte in the input stream to one of these nodes, or to insert a byte into the list.

The present invention can be implemented on almost any data processing system, since it does not require a large amount resources to operate. The compression/decompression routines described above can be implemented on the various data processing systems shown in the network of FIG. 3 to compress data immediately before it is sent over the network and decompress the data upon arrival. The routines can be implemented so they are nearly transparent to application programs executing on the data processing systems. Thus, the present invention provides a way to increase the effective amount of data being sent over a network without having to perform expensive upgrades of either hardware or software.

As indicated above, aspects of this invention pertain to specific "method functions" implementable on computer systems. In an alternate embodiment, the invention may be implemented as a computer program product for use with a computer system. Those skilled in the art should readily appreciate that programs defining the functions of the present invention can be delivered to a computer in many forms, which include (as shown in FIG. 2), but are not limited to: (a) information permanently stored on non-writable storage media (e.g. read only memory devices within a computer such as ROM 58 or CD-ROM disks 78 readable only by a computer I/O attachment); (b) information alterably stored on writable storage media (e.g. floppy disks 74 and hard drives 72); or (c) information conveyed to a computer through communication media, such as network 94, and telephone networks, via modem 92. It should be understood, therefore, that such media, when carrying computer readable instructions that direct the method functions of the present invention, represent alternate embodiments of the present invention.

While the invention has been particularly shown and described with reference to a preferred embodiment, it will be understood by those skilled in the art that various changes in form and detail may be made therein without departing from the spirit and scope of the invention.

What is claimed:

1. A method for compressing digital data, comprising:

initializing a compression tree by creating a plurality of first layer nodes;

receiving digital data to be compressed;

creating child nodes which contain the digital data to be compressed;

placing a first portion of the child nodes into the compression tree, with the child nodes in the first portion being referenced by child pointers;

inserting a second portion of the child nodes into the compression tree in the form of a plurality of sibling groups, with each sibling group having a common parent node, wherein the child nodes in each sibling group are arranged according to a predefined sorting criteria, with the child nodes in the sibling groups being referenced by sibling pointers;

continuing to insert child nodes into the sibling groups according to the predefined sorting criteria as additional digital data to be compressed is received; and outputting index values which define a path from one of the first layer nodes to one of the child nodes, wherein the index values represent the compressed digital data.

2. The method as recited in claim 1, further comprising:

initializing a decompression tree by creating a plurality of first layer nodes;

receiving the index values which represent the compressed digital data;

finding a matching node in the decompression tree which has the received index value;

traversing a path from the matching node to a node in the first layer of nodes; and outputting data values associated with nodes encountered in the traversing step, wherein the compressed digital data represented by the index value is decompressed.

3. The method as recited in claim 2, further comprising:
receiving a subsequent index value;
determining a subsequent node in the first layer of nodes by traversing a path defined by the subsequent index value; and
adding a new node to the matching node, wherein the new node has a data value equal to the subsequent node, wherein the decompression tree is constructed to match the compression tree.

4. The method as recited in claim 2, further comprising reordering the data values from first to last before the outputting step.

5. The method as recited in claim 1, wherein each node in the sibling groups has a right sibling pointer and a left sibling pointer, and wherein the predefined sorting criteria arranges nodes in the sibling groups with the data value of a right node being greater than the data value of the node whose right pointer points to the right node, and the data value of a left node being less than the data value of the node whose left pointer points to the left node.

6. The method as recited in claim 5, wherein the inserting step includes identifying the sibling group into which a node will be placed, then traversing the sibling nodes in the sibling group using the right and left pointers of the sibling nodes to place the node according to the predefined sorting criteria.

7. The method as recited in claim 1, further comprising:
sending the index values generated from the compression tree of a first computer over a computer network; and
receiving the index values on a second computer via the computer network, wherein the data is decompressed.

8. The method as recited in claim 1, wherein the first layer nodes contain nodes having data values for each unit of digital data that can be received.

9. A data processing system for compressing digital data, comprising:
memory means for storing digital information;
processing means, connected to memory means, for operating upon the digital information in the memory means;
the data processing system being operable in a compression mode of operation, wherein,
a compression tree is initialized by creating a plurality of iirst layer nodes;
digital data to be compressed is received;
child nodes which contain the digital data to be compressed are created;
a first portion of the child nodes is placed into the compression tree, with the child nodes in the first portion being referenced by child pointers;
a second portion of the child nodes is inserted into the compression tree in the form of a plurality of sibling groups, with each sibling group having a common parent node, wherein the child nodes in each sibling group are arranged according to a predefined sorting criteria, with the child nodes in the sibling groups being referenced by sibling pointers;
child nodes continue to be inserted into the sibling groups according to the predefined sorting criteria as additional digital data to be compressed is received; and
index values which define a path from one of the first layer nodes to one of the child nodes are output, wherein the index values represent the compressed digital data.

10. The data processing system as recited in claim 9, with the data processing system being operable in a decompression mode of operation, wherein:
a decompression tree is initialized by creating a plurality of first layer nodes;
the index values which represent the compressed digital data are received;
a matching node in the decompression tree is found which has the received index value;
a path from the matching node to a node in the first layer of nodes is traversed; and
data values associated with nodes encountered in the traversing step are output, wherein the compressed digital data represented by the index value is decompressed.

11. The data processing system as recited in claim 10, wherein the decompression mode of operation further includes:
a subsequent index value being received;
a subsequent node in the first layer of nodes being determined by traversing a path defined by the subsequent index value; and
a new node being added to the matching node, wherein the new node has a data value equal to the subsequent node, wherein the decompression tree is constructed to match the compression tree.

12. The data processing system as recited in claim 10, wherein the decompression mode of operation further includes the data values being reordered from first to last before the data values are output.

13. The data processing system as recited in claim 9, wherein each node in the sibling groups has a right sibling pointer and a left sibling pointer, and wherein the predefined sorting criteria arranges nodes in the sibling groups with the data value of a right node being greater than the data value of the node whose right pointer points to the right node, and the data value of a left node being less than the data value of the node whose left pointer points to the left node.

14. The data processing system as recited in claim 13, wherein the compression mode of operation includes the sibling group into which a node will be placed being identified, then traversing the sibling nodes in the sibling group using the right and left pointers of the sibling nodes to place the node according to the predefined sorting criteria.

15. The data processing system as recited in claim 9, further comprising:
a computer network;
a first data processing unit connected to the computer network, wherein the first data processing unit generates the index values using the compression tree and sends the index values over the computer network; and
a second data processing unit connected to the computer network, wherein the second data processing unit receives the index values via the computer network, and decompresses the data.

16. The data processing system as recited in claim 9, wherein the first layer nodes contain nodes having data values for each unit of digital data that can be received.

17. A computer program product having stored computer-readable instructions for directing a data processing system to compress digital data, comprising:
means for initializing a compression tree by creating a plurality of first layer nodes;
means for receiving digital data to be compressed;
means for creating child nodes which contain the digital data to be compressed;

means for placing a first portion of the child nodes into the compression tree, with the child nodes in the first portion being referenced by child pointers;

means for inserting a second portion of the child nodes into the compression tree in the form of a plurality of sibling groups, with each sibling group having a common parent node, wherein the child nodes in each sibling group are arranged according to a predefined sorting criteria, with the child nodes in the sibling groups being referenced by sibling pointers;

means for continuing to insert child nodes into the sibling groups according to the predefined sorting criteria as additional digital data to be compressed is received; and means for outputting index values which define a path from one of the first layer nodes to one of the child nodes, wherein the index values represent the compressed digital data.

18. The computer program product as recited in claim 17, further comprising:

means for initializing a decompression tree by creating a plurality of first layer nodes;

means for receiving the index values which represent the compressed digital data;

means for finding a matching node in the decompression tree which has the received index value;

means for traversing a path from the matching node to a node in the first layer of nodes; and means for outputting data values associated with nodes encountered in the traversing step, wherein the compressed digital data represented by the index value is decompressed.

19. The computer program product as recited in claim 18, further comprising:

means for receiving a subsequent index value;

means for determining a subsequent node in the first layer of nodes by traversing a path defined by the subsequent index value; and means for adding a new node to the matching node, wherein the new node has a data value equal to the subsequent node, wherein the decompression tree is constructed to match the compression tree.

20. The computer program product as recited in claim 18, further comprising means for reordering the data values from first to last before the outputting step.

21. The computer program product as recited in claim 17, wherein each node in the sibling groups has a right sibling pointer and a left sibling pointer, and wherein the predefined sorting criteria arranges nodes in the sibling groups with the data value of a right node being greater than the data value of the node whose right pointer points to the right node, and the data value of a left node being less than the data value of the node whose left pointer points to the left node.

22. The computer program product as recited in claim 21, wherein the means for inserting includes means for identifying the sibling group into which a node will be placed, then traversing the sibling nodes in the sibling group using the right and left pointers of the sibling nodes to place the node according to the predefined sorting criteria.

23. The computer program product as recited in claim 17, further comprising:

means for sending the index values generated from the compression tree of a first computer over a computer network; and means for receiving the index values on a second computer via the computer network, wherein the data is decompressed.

24. The computer program product as recited in claim 17, wherein the first layer nodes contain nodes having data values for each unit of digital data that can be received.

* * * * *

UNITED STATES PATENT AND TRADEMARK OFFICE
CERTIFICATE OF CORRECTION

PATENT NO. : 6,011,871
DATED         : January 4, 2000
INVENTOR(S) : Fan Xu

It is certified that error appears in the above-identified patent and that said Letters Patent is hereby corrected as shown below:

Abstract, ln. 18, delete "outpult", insert -- output --.
Col. 2, ln. 5, delete "those", insert -- these --.
Col. 3, ln. 4, delete "ifter", insert -- after --.
Col. 3, ln. 32, delete "utLlized", insert - utilized --.
Col. 3, ln. 36, delete "such a", insert -- such as a --.
Col. 6, ln. 33, delete "network 310 FDDI", insert -- network 310. FDDI --.
Col. 6, ln. 66, delete "In i", insert -- In the --.
Col. 8, ln. 64, delete "node 891 In", insert -- node 891. In --.
Col. 11, ln. 14, delete "Traversed", insert -- traversed --.
Col. 11, ln. 46, delete "output stream, (1008).", insert -- output stream (1008). --.
Col. 13, ln. 46, delete "iirst", insert -- first --.

Signed and Sealed this

Twenty-fourth Day of October, 2000

Attest:

Q. TODD DICKINSON

*Attesting Officer*           *Director of Patents and Trademarks*